United States Patent
Long

(10) Patent No.: US 7,782,979 B2
(45) Date of Patent: Aug. 24, 2010

(54) BASE-BAND DIGITAL PRE-DISTORTION-BASED METHOD FOR IMPROVING EFFICIENCY OF RF POWER AMPLIFIER

(75) Inventor: Maolin Long, Shenzhen (CN)

(73) Assignee: Huawei Technologies Co., Ltd., Shenzhen, Guangdong Province (CN)

( * ) Notice: Subject to any disclaimer, the term of this patent is extended or adjusted under 35 U.S.C. 154(b) by 1137 days.

(21) Appl. No.: 10/511,927

(22) PCT Filed: Jan. 27, 2003

(86) PCT No.: PCT/CN03/00079

§ 371 (c)(1),
(2), (4) Date: May 6, 2006

(87) PCT Pub. No.: WO03/092154

PCT Pub. Date: Nov. 6, 2003

(65) Prior Publication Data

US 2007/0075770 A1    Apr. 5, 2007

(30) Foreign Application Priority Data

Apr. 23, 2002 (CN) .............................. 02 1 17283

(51) Int. Cl.
*H04L 1/02* (2006.01)
(52) U.S. Cl. .................... 375/297; 455/114.3; 330/149; 375/296
(58) Field of Classification Search ................ 375/296; 455/114.3; 330/149
See application file for complete search history.

(56) References Cited

U.S. PATENT DOCUMENTS 6,703,897 B2 *  3/2004  O'Flaherty et al. .......... 330/149

(Continued)

FOREIGN PATENT DOCUMENTS

CN    1204887 A    1/1999

(Continued)

OTHER PUBLICATIONS

Hua Qian et al "A Neural Network Predistorter for Nonlinear Power Amplifiers with Memory" IEEE 2002.*

(Continued)

*Primary Examiner*—David C Payne
*Assistant Examiner*—Leon Flores
(74) *Attorney, Agent, or Firm*—Darby & Darby P.C.

(57) ABSTRACT

The present invention relates to a BDPD-based method for improving efficiency of RF power amplifier, comprising: first, choose key neural network architecture and scale and input initial values of modeling data and network parameters necessary for establishing the neural network model for RF power amplifier; second, correct network parameters with back propagation method and output the neural network model for RF power amplifier when the error meets the criterion; next, solve the pre-distortion algorithm of the RF power amplifier with said model and then carry out pre-distortion processing for the input with the pre-distortion algorithm and feed the input to the RF power amplifier. The present invention can be used to establish a neural network model with adequate accuracy and easy to solve corresponding pre-distortion algorithm for RF power amplifier, in order to improve RF power amplifier efficiency, reduce costs, and suppress out-of-band spectrum leakage effectively through base-band digital pre-distortion technology.

19 Claims, 8 Drawing Sheets

U.S. PATENT DOCUMENTS

| | | | | |
|---|---|---|---|---|
| 6,734,731 | B2* | 5/2004 | Cavers et al. | 330/149 |
| 6,928,122 | B2* | 8/2005 | Opas et al. | 375/296 |
| 6,956,433 | B2* | 10/2005 | Kim et al. | 330/149 |
| 7,333,559 | B2* | 2/2008 | Song et al. | 375/296 |
| 2003/0207680 | A1* | 11/2003 | Yang et al. | 455/341 |
| 2005/0024138 | A1* | 2/2005 | White et al. | 330/149 |

FOREIGN PATENT DOCUMENTS

| | | |
|---|---|---|
| CN | 1291000 A | 4/2001 |
| WO | WO 99/57806 A1 | 11/1999 |
| WO | WO 00/74232 A1 | 12/2000 |
| WO | 01/05026 | 1/2001 |

OTHER PUBLICATIONS

Changsoo Eun et al "Utilization of Neural Network Signal Processing in the Design of a Predistorter for a Nonlinear Telecommunication Channel" IEEE 1994.*

Bruce E. Watkins et al "Neural Network Based Adaptive Predistortion For The Linearization of NonLinear RF Amplifiers" IEEE 1995.*

Bruce E. Watkins et al "Predistortion of NonLinear Amplifiers Using Neural Networks" IEEE 1996.*

International Search Report from International Application No. PCT/CN03/00079.

* cited by examiner

BASE-BAND DIGITAL PRE-DISTORTION-BASED METHOD FOR IMPROVING EFFICIENCY OF RF POWER AMPLIFIER

CLAIM OF PRIORITY

This application is a U.S. national phase application under 35 U.S.C. §371 of International Patent Application No. PCT/CN03/00079 filed Jan. 27, 2003, and claims the benefit of priority of Chinese Patent Application No. 02117283.8 filed Apr. 23, 2002. The International Application was published in the Chinese language on Nov. 6, 2003 as WO 2003/092154.

FIELD OF THE INVENTION

The present invention relates to a method for improving RF power amplifier efficiency in broadband wireless communication systems, particularly to a BDPD-based (Base-band Digital Pre-Distortion) method for improving RF power amplifier efficiency.

BACKGROUND OF THE INVENTION

The limitation of RF bandwidth resource has stringent restrictions to out-of-band spectrum leakage or adjacent channel power leakage of special RF transmitters working in specified frequency bands. The nonlinear characteristic of RF power amplifier near the saturated working space causes the frequency spectrum of output signals under higher input signal condition higher than the frequency spectrum of the input signals, i.e., the nonlinear characteristic of RF power amplifier results in out-of-band spectrum leakage. Therefore, to depress out-of-band spectrum leakage or adjacent channel power leakage, the RF power amplifier in a communication system usually works in the linear working space, which is far away from the saturated working space. However, that method severely degrades efficiency of RF power amplifier and makes RF power amplifier bulky due to heat dissipation requirement, increasing the cost of RF power amplifier. To solve above problem, an effective measure is to utilize base-band digital pre-distortion technology, which requires establishing a mathematical model for RF power amplifier to calculate pre-distortion first.

To solve sole out-of-band spectrum leakage problem, base-band digital pre-distortion technology is developed for digital mobile communication systems in recent years. The object of that technology is to avoid out-of-band spectrum leakage and low efficiency of RF power amplifiers. The main ideal of base-band digital pre-distortion technology is to carry out preprocessing (i.e., pre-distortion) for input X of RF power amplifier to obtain Xy, which ensures the output Y of RF power amplifier is linear to the original input X; when there is linear relationship between input X and output Y of RF power amplifier, boosting the power output will not cause out-of-band spectrum leakage. Since the pre-distortion is accomplished through base-band digital signal preprocessing, the RF power amplifier shown in FIG. 1 actually represents the entire RF transmission channel from base-band to carrier (up-conversion) and then from carrier to, base-band (down-conversion for signal feedback), including the RF power amplifier.

To solve the 'pre-distortion' algorithm in FIG. 1, it is necessary to know the mathematical model of the RF power amplifier; furthermore, that mathematical model should be established specially for solving the pre-distortion algorithm, that is to say, the mathematical model requires minimum calculating workload and memory occupation to solve the pre-distortion algorithm. Such a mathematical model for RF power amplifier is usually a black-box model, i.e., it reflects (Input/Output) I/O relationship of the object (RF power amplifier). As shown in FIG. 2, the difference e between output Y of RF power amplifier and the output Ym of the model is used to refine or correct the model. When e reaches to 0, the model represents the I/O characteristic of RF power amplifier accurately. In actual practice, when e is small enough, it is deemed that the model can reflects I/O relationship of the RF power amplifier at certain accuracy.

Usually, the relationship between input X and output Y of the RF power amplifier comprises amplitude ($|X|$ and $|Y|$) and phase ($\Phi_{in}$ and $\Phi_{out}$) of base-band digital signal X and Y; wherein the relationship between input amplitude $|X|$ and output amplitude $|Y|$ is referred as AM-AM model of RF power amplifier.

$$|Y|=f(|X|). \tag{1}$$

The relationship between input amplitude $|X|$ and I/O phase deviation $\Delta\Phi$ is referred as AM-PM model:

$$\Delta\Phi=g(|X|), \tag{2}$$

herein: $\Delta\Phi=\Phi_{out}-\Phi_{in}$.

However, for broadband systems, no one has studied AM-PM model successfully yet, even the opinions about the profile of typical AM-PM curve vary; most AM-PM curves in documentation are sketched drawings, which are neither reliable nor supported by experimental data.

Presently, the major part of study work for model of RF power amplifier focuses on establishing AM-AM model for RF power amplifier. Wherein, a typical polynomial model (from PCT patent of PMC (Canada): WO 01/05026 A1) based on I/O amplitude relationship of RF power amplifier (i.e., AM-AM model) involves some delay items of input signal. That model can be used to describe some nonlinear characteristics (e.g., saturation and delay cycle (or, referred as memory)) of RF power amplifier in I/O amplitude aspect. However, that polynomial model has the following disadvantages:

1. The parameter estimation of the polynomial model involves huge calculating workload, which increases exponentially to the order number of the polynomial.

2. After the AM-AM model of RF power amplifier is obtained with the Polynomial method, it is difficult to solve the pre-distortion algorithm corresponding to the polynomial model; especially, when a higher order polynomial model has to be used due to accuracy requirement, it is nearly impossible to obtain the analytic solution of reverse function of the pre-distortion algorithm; as for numerical approach, the calculating workload increases quickly in non-linear manner as the order of the polynomial increases.

3. In a self-adapting pre-distortion system, the model of RF power amplifier has to be stored in the controller; in addition, the output of the model corresponding to input of RF power amplifier has to be calculated online, in order to update the model and the pre-distortion parameters of the self-adapting pre-distortion unit online. However, a polynomial model of RF power amplifier requires a huge storage space, the reason is: in the polynomial approach, as the order of the model increases, the number of the parameters of the model increases; also, a group of new exponential functions will be introduced into the model (the number of the exponential functions depends on the number of delay items in the model). When the model is to be stored, the new parameters have to be stored and a group of tables is required to store those exponential functions (or a multiplier is required), therefore the model storage space is enlarged.

4. The polynomial model (AM-AM model) has been used; however, though many efforts have been exerted in AM-PM model, there is no successful implementation yet. Furthermore, the foundation of arbitrarily correlating input amplitude with I/O phase deviation solitarily in some documents is doubtful.

SUMMARY OF THE INVENTION

An object of the present invention is to provide a BDPD-based method for improving efficiency of RF power amplifier, which can depress out-of-band spectrum leakage of RF power amplifier and improve efficiency of RF power amplifier effectively.

To attain said object, the BDPD-based method for improving efficiency of RF power amplifier according to the present invention comprises:

(1) Determining structural parameters of a neural network as required and establishing the neural network, inputting modeling data and initial values of network parameters required for establishing the neural network model of the RF power amplifier;

(2) Propagating forward with the input data and network parameters, calculating the difference between output value of the neural network and the corresponding expected output value, then propagating backward along the neural network with said difference to correct the network parameters;

(3) Determining whether said difference meets the specified criterion; if so, outputting the neural network model of the RF power amplifier and going to step (4), otherwise inputting the corrected network parameters to the neural network and going to step (2);

(4) Solving the pre-distortion algorithm of the RF power amplifier with said neural network model;

(5) Carrying out pre-distortion processing for input signal of the RF power amplifier with said pre-distortion algorithm and then feeding them to the RF power amplifier.

Said structural parameters comprise: the number n of delay items of input signal, the number r of neural elements on each layer of the neural network, the number m of layers of the neural network; said modeling data comprises: output signal Y(KT), input signal, and delay items of input signal of the power amplifier; said network parameters comprise: weight $W_{ijk}$ and bias $b_{ij}$; said output signal Y(KT) of the RF power amplifier is the expected output value corresponding to the input signal, i.e., the actual output value of the RF power amplifier corresponding to the input signal.

Said input signal and said delay items of the input signal are base-band digital signal amplitude X(KT) of the power amplifier and delay items thereof X[(K−1)T] ... X[(K−n+1)T], respectively.

Herein, the number n of delay items of input signal is: 1<n<10, the number r of neural elements on each layer of the neural network is: 1<r<10, the number m of layers of the neural network is: 1<m<10.

Said input signal and said delay items of input signal are base-band digital signal amplitude X(KT) of the power amplifier and delay items thereof X[(K−1)T], X[(K−2)T], ... , X[(K−n+1)T] as well as phase $\Phi_{in}$(KT) of the base-band digital signal and delay items thereof $\Phi_{in}$[(K−1)T], $\Phi_{in}$[(K−2)T], ... , $\Phi_{in}$[(K−n+1)T]; the number of delay items of the input signal comprises the number n1 of delay items of base-band digital signal amplitude and the number n2 of delay items of base-band digital signal phase.

Herein, 1<n1<5, 1<n2<10, 1≦r≦10, 1≦m≦10.

Said step (2) comprises:

(71) Calculating the corresponding intermediate variables $V_{ij}$ of the neural network with network parameters $W_{ijk}$ of each layer of the neural network;

(72) Activating the function to calculate the output value $Y_{ij}$ of each neural element in the corresponding neural network through the intermediate variables $V_{ij}$ and the neural elements;

(73) Magnifying the output value of the neural elements on the last layer of the neural network for m times to obtain the output value $Y_m$(KT) of the neural network, herein the value of M being higher than the saturation level of the power amplifier;

(74) Calculating the difference between $Y_m$(KT) and actual output Y(KT) of the power amplifier;

(75) Magnifying the difference e(kT) between $Y_m$(KT) and Y(KT) for −m times and calculating $\Omega(V_{ij})$ with output value $V_{ij}$ of the neural elements on the last layer of the network, herein, $\Omega(v)=d\psi(v)/dv$;

(76) Multiplying Me(kT) with $\Omega(V_{ij})$ to obtain $\delta_{ij}$;

(77) Propagating $\delta_{ij}$ backward along the network channel, in which propagating forward is carried out, with current values of network parameters and obtaining the intermediate variables $u_{i1}, u_{i2}, \ldots, u_{ir}$;

(78) Calculating intermediate variables $\delta_{i1}, \delta_{i2}, \ldots, \delta_{ir}$ with $u_{i1}, u_{i2}, \ldots, u_{ir}$ and current network parameters;

Herein, $\delta_{i1}, \delta_{i2}, \ldots, \delta_{ir}$ are obtained through multiplying $\Omega(V_{i1}), \Omega(V_{i2}), \ldots, \Omega(V_{ir})$ with $u_{i1}, u_{i2}, \ldots u_{ir}$ respectively, said $\Omega(V_{i1}), \Omega(V_{i2}), \ldots \Omega(V_{ir})$ are calculated out with intermediate variable $v_{i1}, v_{i2}, \ldots, v_{ir}$;

(79) Updating current network parameters with $\delta_{i1}, \delta_{i2}, \ldots, \delta_{ir}$, and calculating c with the following equation: $c=[\Sigma(\delta_{i1}^2+\delta_{i2}^2+\ldots+\delta_{ir}^2)+\delta_{ij}^2]^{1/2}$;

Wherein when updating the current network parameters, the updated network parameters $W_{ijk}$ and $b_{ij}$ are calculated out as follows:

$W_{ijk}$=value of network parameter before update−η× $\delta_{ij}$×output value of corresponding neural elements, herein η is the searching step length;

$b_{ij}$=value of network parameter before update−η×$\delta_{ij}$;

Said step (3) comprises: determining whether c meets the criterion; if so, outputting the neural network model of the RF power amplifier, otherwise inputting the corrected network parameters $W_{ijk}$ and $b_{ij}$ to the neural network and going to step (71).

Said K=2×mean gain kb of RF power amplifier.

The bandwidth of said input signal is wider than that of actual input signal of RF power amplifier.

It can be seen from above technical solution that the present invention provides a new BDPD-oriented modeling method for RF power amplifier, i.e., a neural network method, which comprises AM-AM neural network method orienting to I/O amplitude relationship of RF power amplifier, neural network method orienting to phase bias model of RF power amplifier, and structural design and parameter estimation for the neural network model in the method. According to the neural network for establishing mathematical model for RF power amplifier, the calculating workload increases in linear manner as the model becomes more complex; and said neural network model is particularly suitable for solving pre-distortion algorithm.

In addition, sine the only nonlinear function of the model is an activation function, only one table is require to store the nonlinear function when the corresponding self-adapting digital pre-distortion system is implemented, therefore, the model requires small storage space when storage is performed, and the required storage space increases little as the model becomes more complex, because only the new network parameters are to be stored and the category and number of nonlinear function keeps constant; the phase bias model according to the present invention correlates I/O phase bias and input amplitude, input phase, and their delay items, so that a more reliable and feasible phase bias model for RF power amplifier is established, which takes account all external factors that may affect phase bias into input variables of the model; therefore, the model is a RF power amplifier I/O phase bias model that is more sophisticated than traditional AM-PM models.

Therefore, the present invention attains the object of improving efficiency of RF power amplifier through establishing an accurate mathematical model for RF power amplifier.

DETAILED DESCRIPTION OF THE EMBODIMENTS

Figure 1:
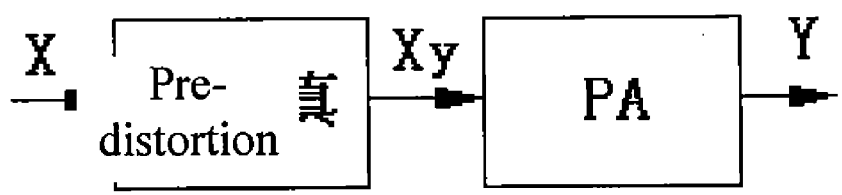
FIG. 1 is a prior art schematic diagram of improving efficiency of RF power amplifier.
Figure 2:
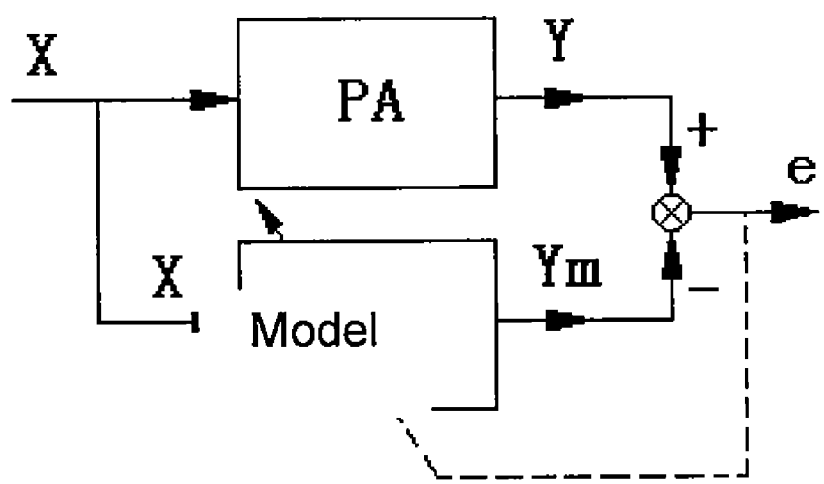
FIG. 2 is a prior art schematic diagram of establishing the RF power amplifier model.
Figure 3:
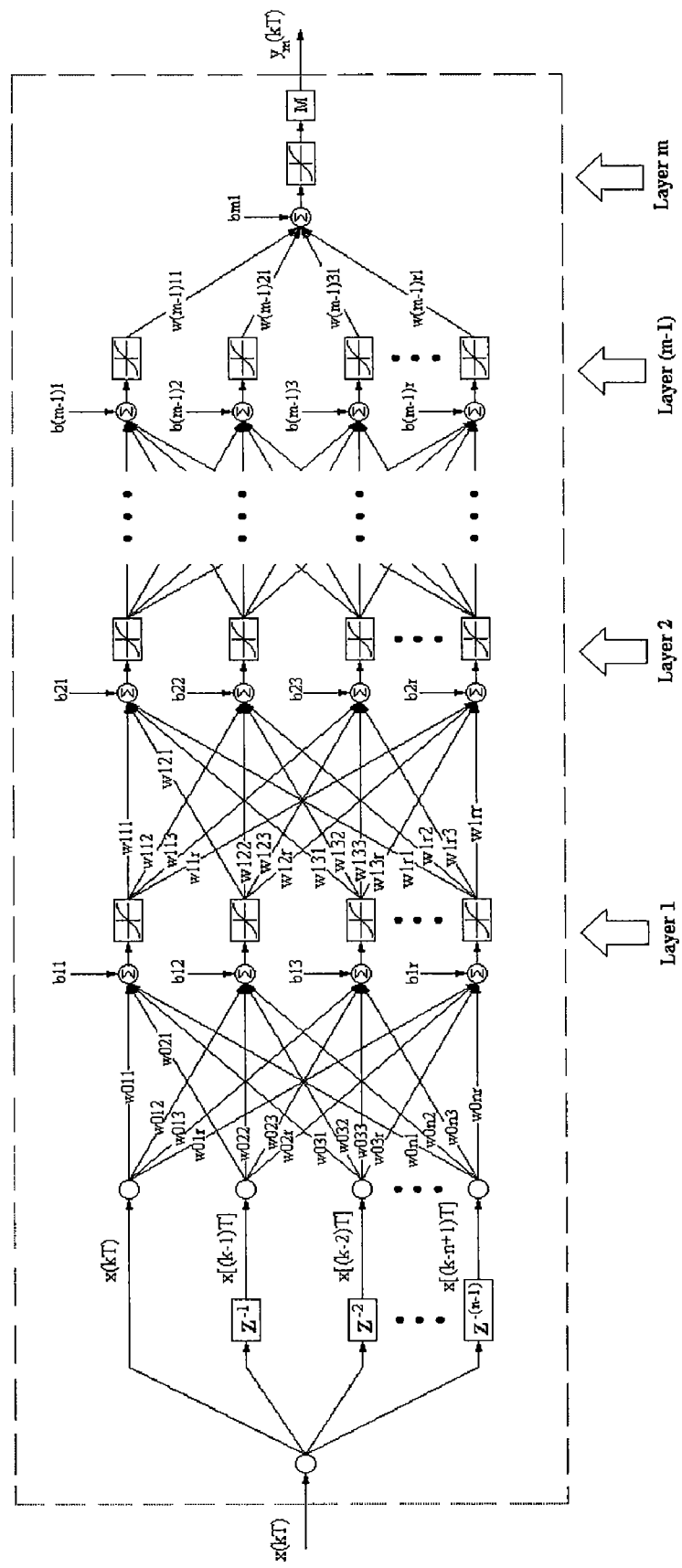
FIG. 3 is a schematic diagram of AM-AM model orienting to I/O amplitude relationship of RF power amplifier.
Figure 6:
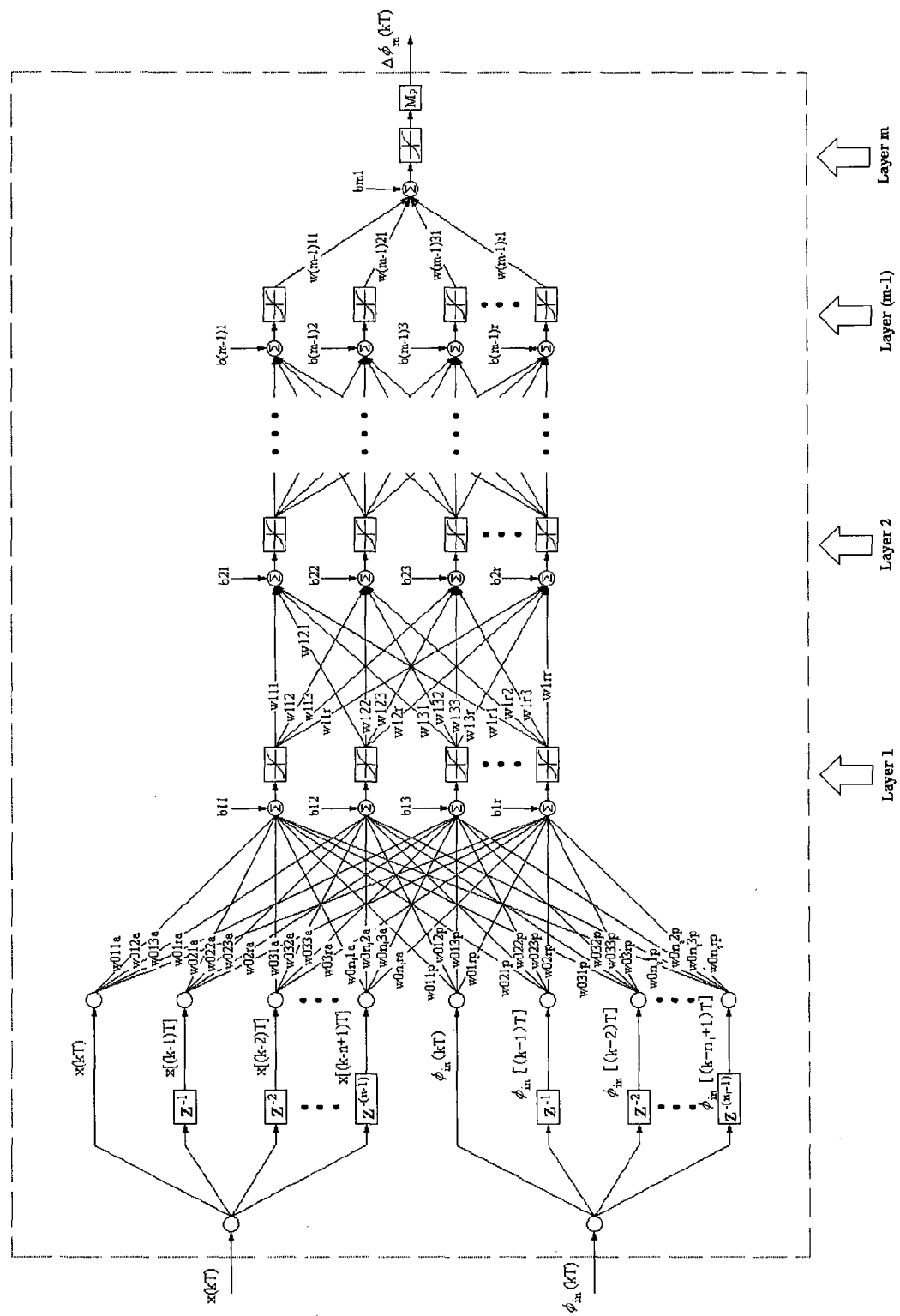
FIG. 6 shows the neural network modeling method for establishing phase bias model for RF power amplifier.

The BDPD-based method for improving efficiency of RF power amplifier according to the present invention improves efficiency of RF power amplifier through carrying out pre-distortion processing for input of RF power amplifier; the specific pre-distortion processing depends on the mathematical model of the RF power amplifier; the present invention improves efficiency of RF power amplifier through providing a method for establishing an accurate mathematical model for RF power amplifier; the present invention relates to a BDPD-based modeling method, i.e., neural network method for RF power amplifier, which comprises AM-AM neural network modeling method orienting to I/O amplitude relationship of RF power amplifier shown in FIG. 3, AM-PM neural network modeling method orienting to phase bias of RF power amplifier shown in FIG. 6, and structural design and parameter estimation for the neural network models in above method.

Hereunder the embodiments for improving efficiency of RF power amplifier through establishing AM-AM model for RF power amplifier are described in further detail with reference to FIG. 4 and FIG. 5.

Figure 4:
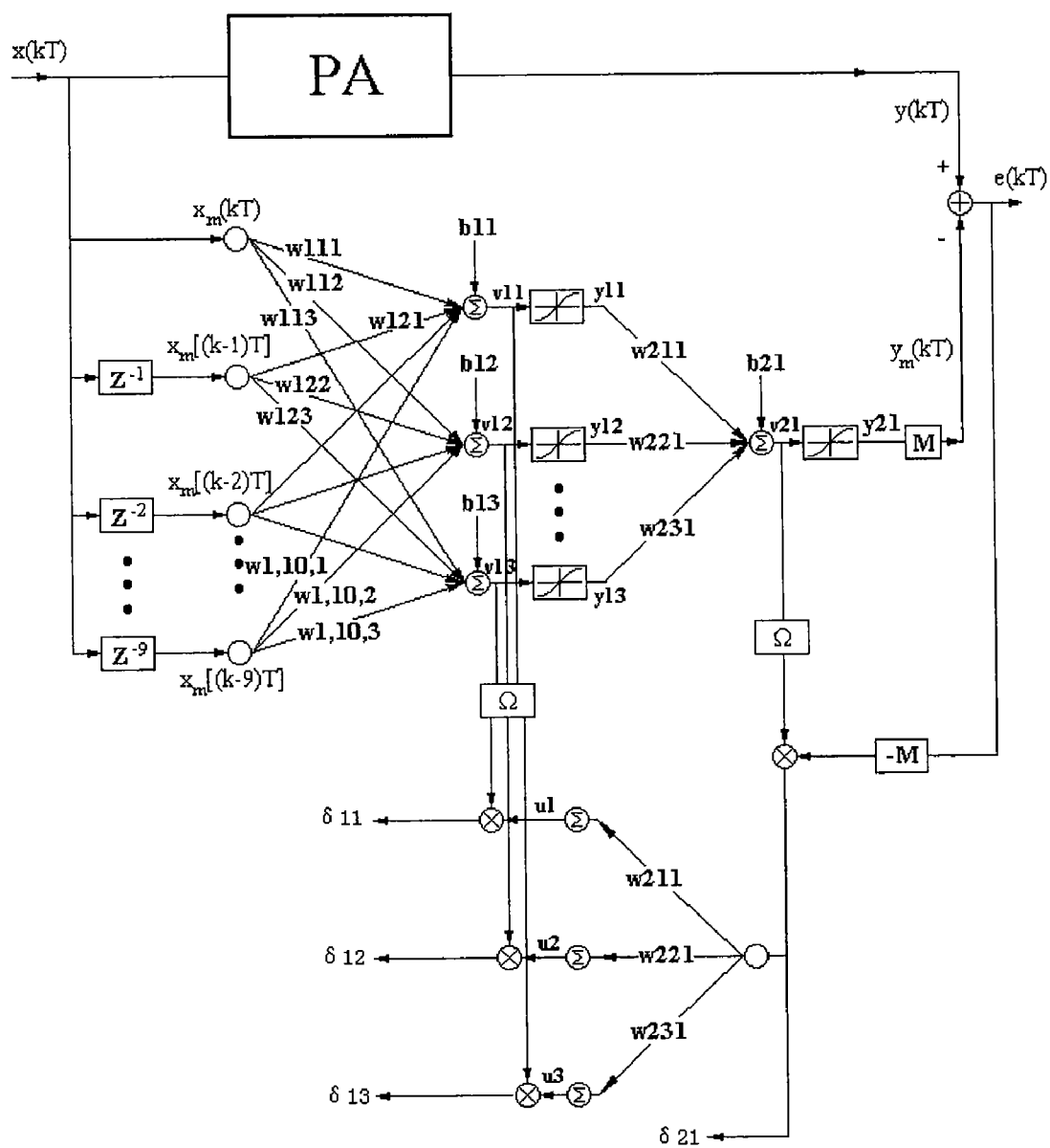
FIG. 4 is a schematic diagram of the neural network model used in establishing AM-AM model for RF power amplifier.
Figure 5:
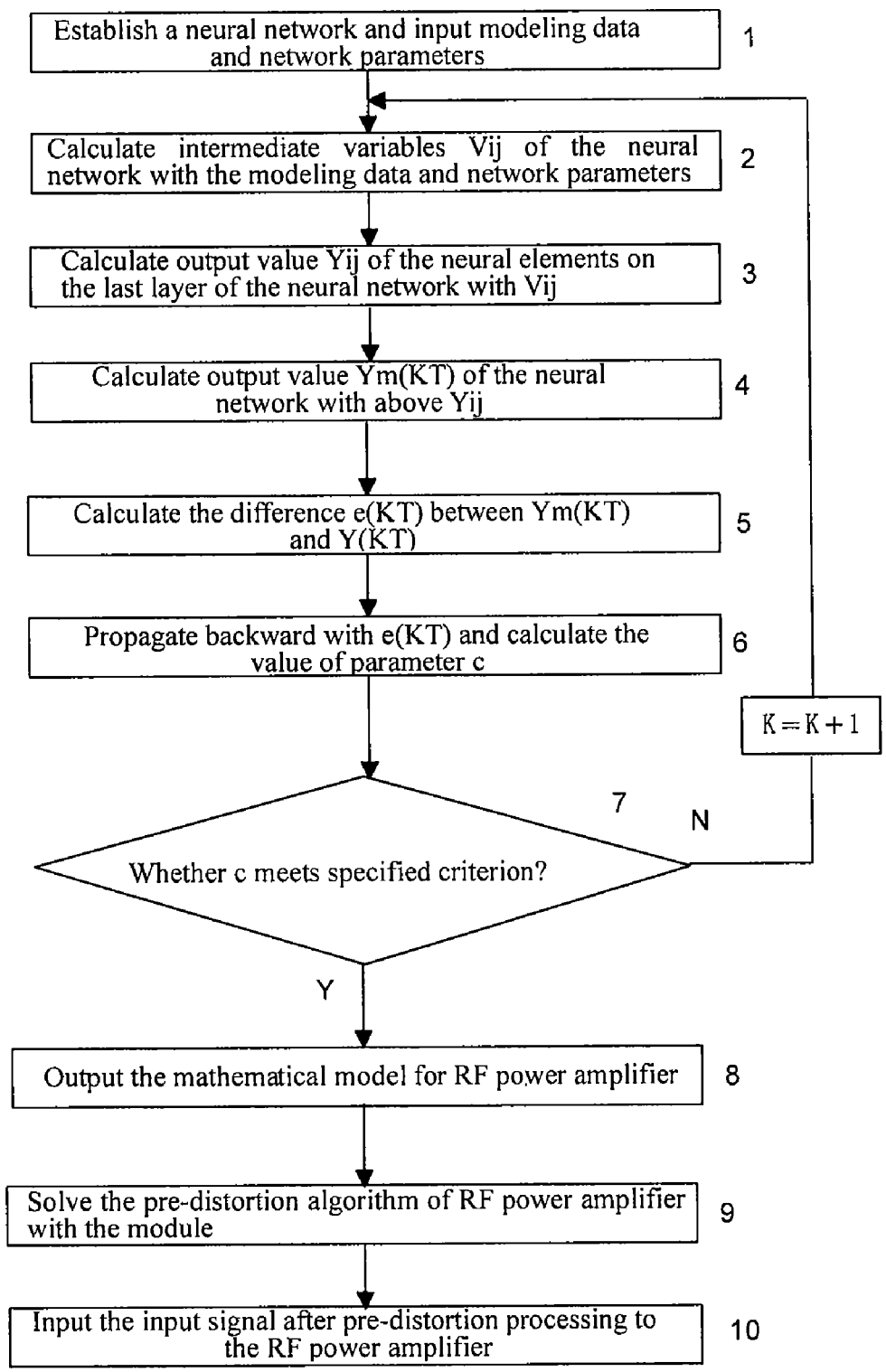
FIG. 5 is a calculating flowchart for establishing AM-AM model for RF power amplifier.
Figure 7:
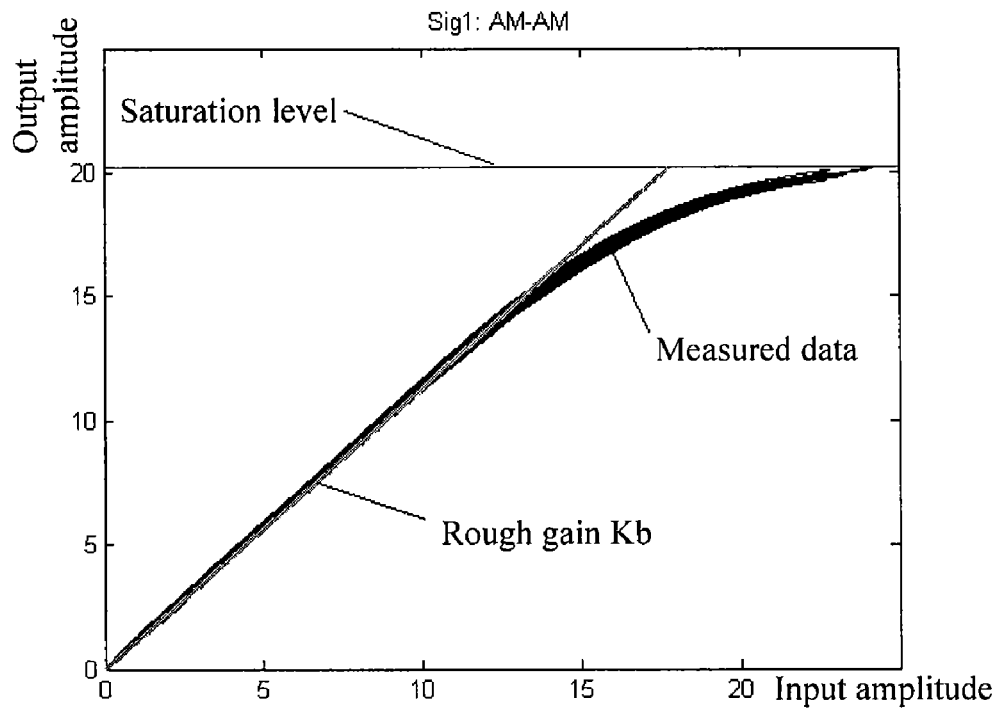
FIG. 7 is a schematic diagram of AM-AM characteristic of actual RF power amplifier.

Step 1: Determine structural parameters of a neural network as required and establish the neural network; input modeling data and initial values of network parameters required for establishing the neural network model of the RF power amplifier;

The structural parameters comprise: the number n of delay items of input signal, the number r of neural elements on each layer of the neural network, the number m of layers of the neural network; the modeling data comprises: output signal Y(KT), input signal, and delay items of input signal of the power amplifier; said output signal Y(KT) of the RF power amplifier is the actual output value of the RF power amplifier corresponding to the input signal; the input signal and said delay items of input signal are base-band digital signal amplitude X(KT) of the power amplifier and delay items thereof X[(K−1)T] ... X[(K−n+1)T]; said network parameters comprise weight Wijk and bias bij;

Herein, the structural parameters of the neural network are selected as follows: 1<n<10, 1<r<10, 1<m<10;

Wherein the K value in base-band digital signal function is 2× the gain Kb of RF power amplifier; as shown in FIG. 7, in the AM-AM characteristic curve obtained with actual measured data of RF power amplifier, Kb is the rough mean gain of the linear segment;

The network parameters of the neural network shown in FIG. 4 are: r=3, m=2, n=9; choose K=10; choose initial value Wijk (0) and bij (0) for network parameters Wijk and bij respectively and then input them to the neural network; input x(10T) to $x_m$(KT) of the neural network; input x(9T) to $x_m$[(k−1)T]; input x(8T) to $x_m$[(k−2)T], and input x(7T) to $x_m$[(k−3)T], ..., input x(T) to $x_m$[(k−9)T].

After the neural network is established and the modeling data and network parameters are inputted, propagate forward with the input data network parameters to calculate output value of the neural network, and then propagate backward along above neural network with the difference between the output value and the expected output value corresponding to the input signal to correct the network parameters; wherein the expected output value is the output value Y(KT) of the RF power amplifier where the modeling data is inputted.

Step 2: calculate out the corresponding intermediate variable Vij in the neural network with network parameters Wij input signal and delay items of the input signal on each layer of the neural network;

i.e., calculate out V11, V12 and V13 in the neural network shown in FIG. 4, herein:

$$V11 = W111 \times Xm(KT) + W121 \times Xm[(K-1)T] + \ldots + W1,10,1 \times Xm[(K-9)T] + b11;$$

$$V12 = W112 \times Xm(KT) + W122 \times Xm[(K-1)T] + \ldots + W1,10,2 \times Xm[(K-9)T] + b12;$$

$$V13 = W113 \times Xm(KT) + W123 \times Xm[(K-1)T] + \ldots + W1,10,3 \times Xm[(K-9)T] + b13;$$

Step 3: take intermediate variables Vij as independent variables and utilize the neural element activation function to calculate neural element output value Yij in the neural network; take output value of neural elements on the intermediate layer of the neural network as input value of the neural elements on the lower layer and utilizes them to calculate the corresponding intermediate variable Vij.

The activation function used in the calculation is:

$$\Psi(v) = (1 - e^{-Kv})/(1 + e^{-Kv});$$

Take the calculated V11, V12, and V13 as independent variables to calculate Y11, Y12, and Y13 shown in FIG. 4; then utilize the calculated Y11, Y12, and Y13 to calculate V21, herein V21=W211×Y11+W221×Y12+W231×Y13+ b21); finally, take V21 as the independent variable and utilize the activation function to calculate Y21.

Step 4: Magnify the output value Y21 of the neural elements on the last layer of the neural network for m times to obtain the output value of the neural network Ym (KT); wherein the value of m is higher than the saturation level of the RF power amplifier;

Step 5: Calculate the difference e(KT) between Ym(KT) and actual output Y(KT) of RF power amplifier; wherein the calculating result in the first forward propagation shown in FIG. 4 is e(10T).

Thus a forward propagation along the neural network is finished.

Step 6: utilize the e(10T) to propagate backward along the neural network; magnify e(10T) for −M times and calculate out Ω(Vij) with the output value of the neural elements on the last layer, herein, $\Omega(v)=d\psi(v)/dv$;

As shown in FIG. 4, Ω(V21) is calculated out with the calculated V21;

Multiply −Me(kT) with Ω(Vij) to calculate δij, i.e., in FIG. 4, $\delta 21=\Omega(V21)\times[-Me(10T)]$;

Propagate the variable δij backward along the network channel, in which propagating forward is carried out, with current values of network parameters and obtain intermediate variable ui1, ui2, . . . , uir, i.e., calculate out u1, u2, and u3 in FIG. 4 with current network parameters;

Then utilize ui1, ui2, . . . , uir and current network parameters to calculate out intermediate variable δi1, δi2, . . . , δir;

Wherein δi1, δi2, . . . , δir are calculated out through multiplying ui1, ui2, . . . , uir with Ω(Vi1), Ω(Vi2), . . . , Ω(Vir), which is calculated out from the intermediate variables vi1, vi2, . . . , vir in the neural network respectively;

Update current network parameters with δi1, δi2, . . . , δir, and calculate out c with the following equation: $c=[\Sigma(\delta i1^2+\delta i2^2+\ldots \delta ir^2)+\delta ij^2]^{1/2}$;

Wherein, the updated network parameters Wijk and bij are respectively:

Wijk=value of the network parameter before update−η×δij×output value of corresponding neural elements, herein η is the searching step length;

bij=value of the network parameter before update−η×δij;

As shown in FIG. 4, calculate Ω(v11), Ω(v12) and Ω(v13) with v11, v12 and v13 obtained during forward propagation; multiply Ω(v11), Ω(v12) and Ω(v13) with u1, u2 and u3 respectively to obtain δ11, δ12, and δ13; update w211(0), w221(0), w231(0) and b21(0) with above δ21; the detailed calculation is as follows:

$w211(1)=w211(0)-\eta\times\delta 21\times y11(0)$ $w221(1)=w221(0)-\eta\times\delta 21\times y12(0)$ $w231(1)=w231(0)-\eta\times\delta 21\times y13(0)$ $b21(1)=b21(0)-\eta\times\delta 21$ Wherein η is the searching step length, which is adjusted as required.

Utilize the obtained δ11, δ12, δ13 to update the network parameters w111(0), w112(0), w113(0), b11(0), w121(0), w122(0), w123(0), b21(0), w131(0), w132(0), w133(0), b31(0) etc., on the first layer, as follows:

$w111(1)=w111(0)-\eta\times\delta 11\times x_m(10T)$ $w121(1)=w121(0)-\eta\times\delta 11\times x_m(9T)$ $w131(1)=w131(0)-\eta\times\delta 11\times x_m(8T)$

. . .

$w1,10,1(1)=w1,10,1(0)-\eta\times\delta 11\times x_m(T)$ $b11(1)=b11(0)-\eta\times\delta 11$ $w112(1)=w112(0)-\eta\times\delta 12\times x_m(10T)$ $w122(1)=w122(0)-\eta\times\delta 11\times x_m(9T)$ $w132(1)=w132(0)-\eta\times\delta 11\times x_m(8T)$

. . .

$w1,10,2(1)=w1,10,2(0)-\eta\times\delta 12\times x_m(T)$ $b21(1)=b21(0)-\eta\times\delta 12$ $w113(1)=w113(0)-\eta\times\delta 11\times x_m(10T)$ $w123(1)=w123(0)-\eta\times\delta 11\times x_m(9T)$ $w133(1)=w133(0)-\eta\times\delta 11\times x_m(8T)$

. . .

$w1,10,3(1)=w1,10,3(0)-\eta\delta 13\times x_m(T)$ $b31(1)=b31(0)-\eta\times\delta 13$ Wherein η is the searching step length, which is adjusted as required.

In addition, calculate out c in FIG. 4 with the equation:

$c=(\delta 11^2+\delta 12^2+\delta 13^2+\delta 21^2)^{1/2}$.

Step 7: determine whether c meet the criterion; if so, go to step 8; otherwise input the adjusted network parameters Wijk and bij to the neural network and set K=K+1, i.e., set K=11 in the neural network shown in FIG. 4, and then go to step 2;

If c is small enough, terminate the training process. The satisfactory value of c may be determined according to the convergence situation of the model during training process. In the initial phase, a fixed number of iterations may be set as the condition to terminate the training process.

Step 8: output the neural network model for RF power amplifier and go to step 9.

Step 9: Solve the pre-distortion algorithm of the RF power amplifier with the neural network model.

Step 10: Carry out pre-distortion processing for input signal of the RF power amplifier with the pre-distortion algorithm and then feed them to the RF power amplifier.

Through above process, an accurate AM-AM neural network model orienting to I/O amplitude relationship of RF power amplifier can be established and can be used to solve pre-distortion algorithm for the RF power amplifier to improve efficiency of RF power amplifier. In addition, the pre-distortion algorithm for RF power amplifier can also be solved through establishing a neural network model orienting to phase bias of RF power amplifier to improve efficiency of RF power amplifier. When a neural network model orienting to phase bias of RF power amplifier is established (the structure of such a neural network is shown in FIG. 6), the input signal and said delay items of the input signal are base-band digital signal amplitude X(KT) of the power amplifier and delay items thereof X[(K−1)T], X[(K−2)T], . . . , X[(K−n+1)T] as well as phase $\Phi_{in}$(KT) of the base-band digital signal and delay items thereof $\Phi_{in}$[(K−1)T], $\Phi_{in}$[(K−2)T], . . . $\Phi_{in\,[(K-n+}$1)T]; the number of delay items of the input signal comprises the number n1 of delay items of base-band digital signal amplitude and the number n2 of delay items of base-band digital signal phase.

In establishing the neural network model orienting to phase bias of RF power amplifier, the number of delay items of base-band digital signal is: $1<n1<5$, the number of delay items of base-band digital signal phase is: $1<n2<10$, the number of neural elements on each layer of the neural network is: $1<r<10$, the number of layers of the neural network is: $1<m<10$; in this case, the value of K is: K=1, the value of M is: M>the maximum I/O phase bias (i.e., $>\max\Delta\phi$).

The principle of the calculation for establishing the neural network model orienting to phase bias of RF power amplifier is identical to that of the calculation for calculating the AM-AM neural network model orienting to I/O amplitude relation for RF power amplifier.

Compared with traditional AM-PM models, the advantage of the neural network modelling method orienting to I/O phase bias of RF power amplifier according to the present invention is obvious. Traditional AM-PM models only correlate input amplitude with phase bias simply, not taking account into the effects of phase size of input signal, amplitude variation rate of input signal, and input phase variation rate to I/O phase bias. Whereas the neural network model orienting to phase bias takes account into possible effects of all external factors to base-band phase bias of RF power amplifier through introducing input amplitude and the delay items thereof as well as input phase and the delay items thereof of RF power amplifier at the input end.

In the I/O modelling data of RF power amplifier used in the modelling process for establishing above two mathematical models for RF power amplifier, the bandwidth of input must be wider than that of actual inputs of RF power amplifier corresponding to above models, to ensure adequate accuracy of the mathematical models for the RF power amplifier. That is to say, suppose the operating bandwidth of CDMA or WCDMA system for the RF power amplifier is kF (wherein k is an integer, F is bandwidth of individual carrier), the design principle for bandwidth Fm of modelling signals is:

Fm>kF.

Wherein, a bandwidth of at least an additional out-of-band carrier is required. In addition, the amplitude and/or phase bias of modelling signals should be high enough, in order to cover actual operation range of RF power amplifier with sufficient data.

Figure 8:
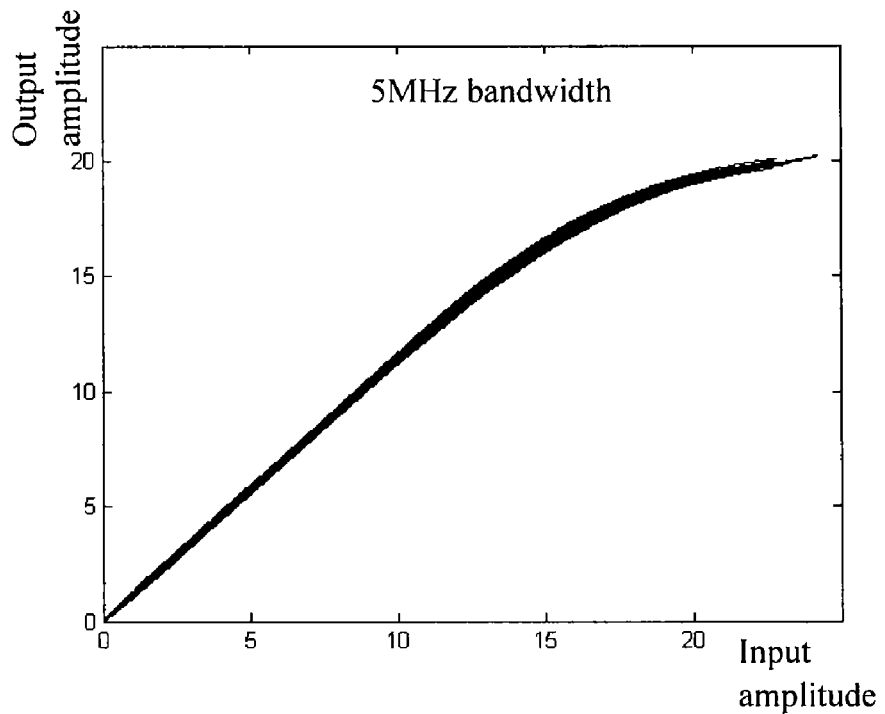
FIG. 8 is a schematic diagram of characteristic of modeling signals.
Figure 9:
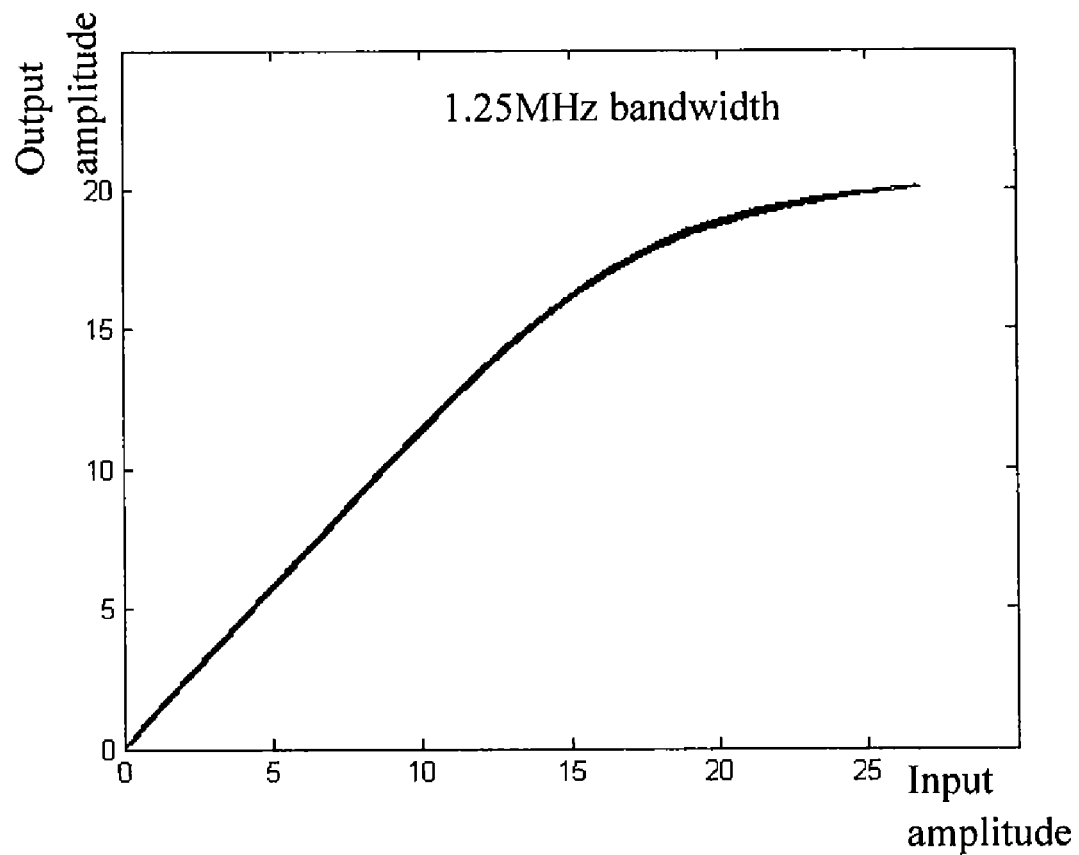
FIG. 9 is a schematic diagram of characteristic of model verification signals.
Figure 10:
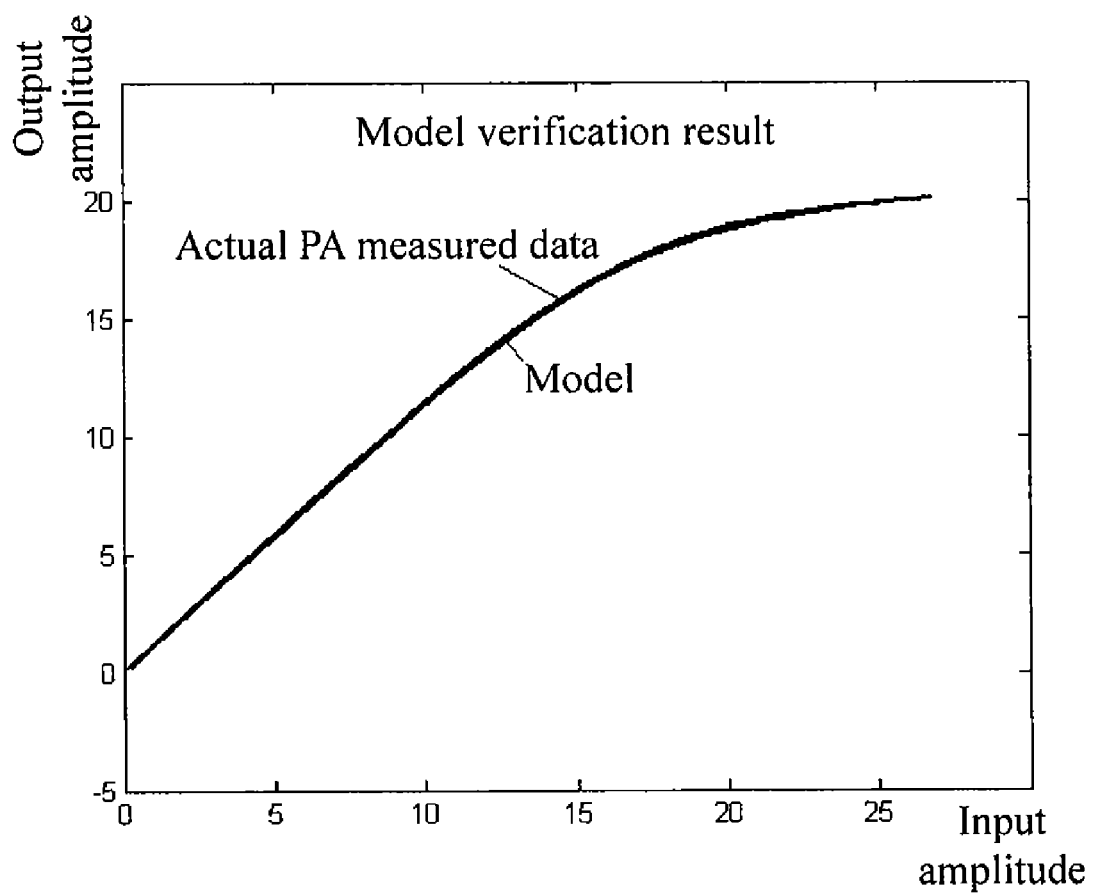
FIG. 10 is a schematic diagram of the model verification result.

The AM-AM neural network modelling method for RF power amplifier has been verified with experimental data (5 MHz bandwidth modelling signals). As shown in FIG. 8, the AM-AM neural network model is trained (i.e., modelling) and then verified with another 1.25 MHz bandwidth signal, as shown in FIG. 9; the result is shown in FIG. 10, in which the difference between model data and actual data of RF power amplifier is almost imperceptible. In addition, it is easy to solve the corresponding pre-distortion algorithm with that model and the solving difficulty will not aggravate as model size expands, in contrast to the case of polynomial modelling method; after the pre-distortion algorithm is solved, the object of improving efficiency of RF power amplifier can be attained with the pre-distortion algorithm.

The invention claimed is:

1. A BDPD-based (Base-band Digital Pre-Distortion) method for improving efficiency of an RF power amplifier, comprising:
   (1) Determining structural parameters of a neural network as required and establishing the neural network, inputting modeling data and initial values of network parameters required for establishing a neural network model of the RF power amplifier;
   (2) Propagating forward with the input data and network parameters, calculating the difference between an output value of the neural network and an expected output value, then propagating backward along the neural network with said difference to correct the network parameters;
   (3) Determining whether said difference meets a specified criterion; if so, outputting the neural network model of the RF power amplifier and going to step (4), otherwise inputting the corrected network parameters to the neural network and going to step (2);
   (4) Solving a pre-distortion algorithm of the RF power amplifier with said neural network model;
   (5) Carrying out pre-distortion processing for input signal of the RF power amplifier with said pre-distortion algorithm and then feeding them to the RF power amplifier;
   wherein said modeling data comprises: output signal Y(KT), input signal, and delay items of input signal of the power amplifier.

2. A BDPD-based method for improving efficiency of RF power amplifier according to claim 1, wherein
   said structural parameters comprise: a number n of delay items of input signal, a number r of neural elements on each layer of the neural network, a number m of layers of the neural network;
   said network parameters comprise: weight Wijk and bias bij;
   said output signal Y(KT) of the RF power amplifier is the expected output value corresponding to the input signal.

3. A BDPD-based method for improving efficiency of RF power amplifier according to claim 2, wherein said input signal and said delay items of the input signal are base-band digital signal amplitude X(KT) of the power amplifier and delay items thereof X[(K−1)T] . . . X[(K−n+1)T], respectively.

4. A BDPD-based method for improving efficiency of RF power amplifier according to claim 3, wherein the number n of delay items of input signal is: $1<n<10$, the number r of neural elements on each layer of the neural network is: $1<r<10$, the number m of layers of the neural network is: $1<m<10$.

5. A BDPD-based method for improving efficiency of RF power amplifier according to claim 2, wherein said input signal and said delay items of input signal are base-band digital signal amplitude X(KT) of the power amplifier and delay items thereof X[(K−1)T], X[(K−2)T], . . . , X[(K−n+1)T] as well as phase Φin(KT) of the base-band digital signal and delay items thereof Φin[(K−1)T], Φin[(K−2)T], . . . , Φin[(K−n+1)T]; the number of delay items of the input signal comprises the number n1 of delay items of base-band digital signal amplitude and the number n2 of delay items of base-band digital signal phase.

6. A BDPD-based method for improving efficiency of RF power amplifier according to claim 5, wherein the number n1 of delay items of the base-band digital signal amplitude is: $1<n1<5$, the number n2 of the delay items of base-band digital signal phase is: $1<n2<10$, the number r of neural elements on each layer of the neural network is: $1<r<10$, the number m of layers of the neural network is: $1<m<10$.

7. A BDPD-based method for improving efficiency of RF power amplifier according to claim 2, wherein said step (2) further comprises:

(71) Calculating corresponding intermediate variables Vij of the neural network with network parameters Wijk of each layer of the neural network;

(72) Activating a function to calculate an output value Yij of each neural element in the corresponding neural network through the intermediate variables Vij and the neural elements;

(73) Magnifying the output value of the neural elements on a last layer of the neural network for m times to obtain an output value Ym(KT) of the neural network, herein the value of M being higher than the saturation level of the RF power amplifier;

(74) Calculating the difference between Ym(KT) and actual output Y(KT) of the RF power amplifier;

(75) Magnifying the difference e(kT) between Ym(KT) and Y(KT) for −m times and calculating $\Omega(Vij)$ with output value Vij of the neural elements on the last layer of the network, herein, $\Omega(v)=d\psi(v)/dv$;

(76) Multiplying Me(kT) with $\Omega(Vij)$ to obtain $\delta ij$;

(77) Propagating $\delta ij$ backward along the network channel, in which propagating forward is carried out, with current values of network parameters and obtaining the intermediate variables ui1, ui2, ..., uir;

(78) Calculating intermediate variables $\delta i1, \delta i2, \ldots, \delta ir$ with ui1, ui2, ..., uir and current network parameters; Herein, $\delta i1, \delta i2, \ldots, \delta ir$ are obtained through multiplying $\Omega(Vi1), \Omega(Vi2), \ldots, \Omega(Vir)$ with ui1, ui2, ... uir respectively, said $\Omega(Vi1), \Omega(Vi2), \ldots \Omega(Vir)$ are calculated out with intermediate variable vi1, vi2, ..., vir;

(79) Updating current network parameters with $\delta i1, \delta i2, \ldots, \delta ir$, and calculating c with the following equation: $c=[\Sigma(\delta i1^2+\delta i2^2+\ldots \delta ir^2)+\delta ij^2]^{1/2}$;

Wherein when updating the current network parameters, the updated network parameters Wijk and bij are calculated out as follows:

Wijk=value of network parameter before update−η× δij×output value of corresponding neural elements, herein η is the searching step length;

bij=value of network parameter before update−η×ij.

8. A BDPD-based method for improving efficiency of RF power amplifier according to claim 7, wherein said step (3) comprises: determining whether c meets the criterion; if so, outputting the neural network model of the RF power amplifier, otherwise inputting the corrected network parameters Wijk and bij to the neural network and going to step (71).

9. A BDPD-based method for improving efficiency of RF power amplifier according to claim 7, wherein said K=2× mean gain kb of RF power amplifier.

10. A BDPD-based method for improving efficiency of RF power amplifier according to claim 2, wherein a bandwidth of said input signal is wider than that of actual input signal of RF power amplifier.

11. A BDPD-based (Base-band Digital Pre-Distortion) method for improving efficiency of RF power amplifier, comprising:

(1) Determining structural parameters of a neural network as required and establishing the neural network, inputting modeling data and initial values of network parameters required for establishing a neural network model of the RF power amplifier;

(2) Propagating forward with the input data and network parameters, calculating the difference between output value of the neural network and an expected output value, then propagating backward along the neural network with said difference to correct the network parameters;

(3) Determining whether said difference meets a specified criterion; if so, outputting the neural network model of the RF power amplifier and going to step (4), otherwise inputting the corrected network parameters to the neural network and going to step (2);

(4) Solving the pre-distortion algorithm of the RF power amplifier with said neural network model;

(5) Carrying out pre-distortion processing for input signal of the RF power amplifier with said pre-distortion algorithm and then feeding them to the RF power amplifier;

wherein-said structural parameters comprise: a number n of delay items of input signal, a number r of neural elements on each layer of the neural network, a number m of layers of the neural network; said modeling data comprises: output signal Y(KT), input signal, and delay items of input signal of the power amplifier; said network parameters comprise: weight Wijk and bias bij; said output signal Y(KT) of the RF power amplifier is the expected output value corresponding to the input signal.

12. A BDPD-based method for improving efficiency of RF power amplifier according to claim 11, wherein said input signal and said delay items of the input signal are base-band digital signal amplitude X(KT) of the power amplifier and delay items thereof X[(K−1)T] ... X[(K−n+1)T], respectively.

13. A BDPD-based method for improving efficiency of RF power amplifier according to claim 12, wherein the number n of delay items of input signal is: $1<n<10$, the number r of neural elements on each layer of the neural network is: $1<r<10$, the number m of layers of the neural network is: $1<m<10$.

14. A BDPD-based method for improving efficiency of RF power amplifier according to claim 11, wherein said input signal and said delay items of input signal are base-band digital signal amplitude X(KT) of the power amplifier and delay items thereof X[(K−1)T], X[(K−2)T], ..., X[(K−n+1)T] as well as phase $\Phi in(KT)$ of the base-band digital signal and delay items thereof $\Phi in[(K−1)T], \Phi in[(K−2)T], \ldots, \Phi in[(K−n+1)T]$; the number of delay items of the input signal comprises the number n1 of delay items of base-band digital signal amplitude and the number n2 of delay items of base-band digital signal phase.

15. A BDPD-based method for improving efficiency of RF power amplifier according to claim 14, wherein the number n1 of delay items of base-band digital signal amplitude is: $1<n1<5$, the number n2 of delay items of base-band digital signal phase is: $1<n2<10$, the number r of neural elements on each layer of the neural network is: $1<r<10$, the number m of layers of the neural network is: $1<m<10$.

16. A BDPD-based method for improving efficiency of RF power amplifier according to claim 11, wherein said step (2) comprises:

(71) Calculating the corresponding intermediate variables Vij of the neural network with network parameters Wijk of each layer of the neural network;

(72) Activating the function to calculate the output value Yij of each neural element in the corresponding neural network through the intermediate variables Vij and the neural elements;

(73) Magnifying the output value of the neural elements on the last layer of the neural network for m times to obtain the output value Ym(KT) of the neural network, herein the value of M being higher than the saturation level of the power amplifier;

(74) Calculating the difference between Ym(KT) and actual output Y(KT) of the power amplifier;

(75) Magnifying the difference e(kT) between Ym(KT) and Y(KT) for −m times and calculating Ω(Vij) with output value Vij of the neural elements on the last layer of the network, herein, $\Omega(v) = d\Psi(v)/dv$;

(76) Multiplying Me(kT) with Ω(Vij) to obtain δij;

(77) Propagating δij backward along the network channel, in which propagating forward is carried out, with current values of network parameters and obtaining the intermediate variables ui1, ui2, . . . , uir;

(78) Calculating intermediate variables δi1, δi2, . . . , δir with ui1, ui2, . . . , uir and current network parameters; Herein, δi1, δi2, . . . , δir are obtained through multiplying Ω(Vi1), ≠(Vi2), . . . , Ω(Vir) with ui1, ui2, . . . uir respectively, said Ω(Vi1), ≠(Vi2), . . . Ω(Vir) are calculated out with intermediate variable vi1, vi2, . . . , vir;

(79) Updating current network parameters with δi1, δi2, . . . , δir, and calculating c with the following equation: $c[\Sigma(\delta i1^2 < \delta i2^2 < \ldots + \delta ir^2) + \delta ij^2]^{1/2}$;

Wherein when updating the current network parameters, the updated network parameters Wijk and bij are calculated out as follows:

*Wijk*=value of network parameter before update−η× δ*ij*×output value of corresponding neural elements, herein η is the searching step length;

*bij*=value of network parameter before update−η×δ*ij*.

17. A BDPD-based method for improving efficiency of RF power amplifier according to claim 16, wherein said step (3) comprises: determining whether c meets the criterion; if so, outputting the neural network model of the RF power amplifier, otherwise inputting the corrected network parameters Wijk and bij to the neural network and going to step (71).

18. A BDPD-based method for improving efficiency of RF power amplifier according to claim 16, wherein said K=2× mean gain kb of RF power amplifier.

19. A BDPD-based method for improving efficiency of RF power amplifier according to claim 11, wherein the bandwidth of said input signal is wider than that of actual input signal of RF power amplifier.

* * * * *